US009966120B2

(12) United States Patent
Na

(10) Patent No.: US 9,966,120 B2
(45) Date of Patent: May 8, 2018

(54) SEMICONDUCTOR MEMORY WITH A DATA SENSING CIRCUIT EQUIPPED WITH A LINE LEVEL CONTROL BLOCK FOR PRECHARGING LOCAL I/O LINES TO A FIRST AND SECOND POWER SUPPLY VOLTAGE IN A READ OPERATION

(71) Applicant: SK hynix Inc., Icheon-si, Gyeonggi-do (KR)

(72) Inventor: One Gyun Na, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days. days.

(21) Appl. No.: 15/391,392

(22) Filed: Dec. 27, 2016

(65) Prior Publication Data
US 2017/0110166 A1 Apr. 20, 2017

Related U.S. Application Data

(62) Division of application No. 14/277,207, filed on May 14, 2014, now abandoned.

(30) Foreign Application Priority Data

Feb. 5, 2014 (KR) .................. 10-2014-0012898

(51) Int. Cl.
*G11C 11/4091* (2006.01)
*G11C 7/22* (2006.01)
*G11C 7/12* (2006.01)

(52) U.S. Cl.
CPC . *G11C 7/22* (2013.01); *G11C 7/12* (2013.01)

(58) Field of Classification Search
CPC ............ G11C 11/4091; G11C 11/4094; G11C 11/419; G11C 11/5642; G11C 7/062; G11C 7/065; G11C 7/067; G11C 7/08; G11C 7/06; G11C 7/1069; G11C 7/1048; G11C 7/12
See application file for complete search history.

(56) References Cited

U.S. PATENT DOCUMENTS

| 6,930,939 | B2 | 8/2005 | Lim et al. | |
|---|---|---|---|---|
| 7,477,558 | B2 | 1/2009 | Lee et al. | |
| 8,213,248 | B2 | 7/2012 | Moon et al. | |
| 8,223,568 | B2 * | 7/2012 | Seo | G11C 5/025 365/194 |
| 8,559,254 | B2 * | 10/2013 | Kim | G11C 7/1048 365/189.04 |
| 8,913,452 | B2 | 12/2014 | Kim | |

FOREIGN PATENT DOCUMENTS

KR 100482405 B1 4/2005

* cited by examiner

*Primary Examiner* — Andrew Q Tran
(74) *Attorney, Agent, or Firm* — William Park & Associates Ltd.

(57) ABSTRACT

A data sensing circuit may include a pair of first signal lines, and a pair of second signal lines precharged with a first power supply voltage. The data sensing circuit may also include a line level control block configured for applying a second power supply voltage to any one signal line of the pair of second signal lines in response to a read command.

12 Claims, 5 Drawing Sheets

SEMICONDUCTOR MEMORY WITH A DATA SENSING CIRCUIT EQUIPPED WITH A LINE LEVEL CONTROL BLOCK FOR PRECHARGING LOCAL I/O LINES TO A FIRST AND SECOND POWER SUPPLY VOLTAGE IN A READ OPERATION

CROSS-REFERENCES TO RELATED APPLICATION

The present application is a divisional application of U.S. application Ser. No. 14/277,207, filed May 4, 2014, and claims priority under 35 U.S.C. § 119(a) to Korean application number 10-2014-0012898, filed on Feb. 5, 2014, in the Korean Intellectual Property Office, which is incorporated herein by reference in its entirety.

BACKGROUND

1. Technical Field

Various embodiments generally relate to a semiconductor circuit, and more particularly, to a data sensing circuit and a semiconductor apparatus using the same.

2. Related Art

A semiconductor apparatus may include various signal lines for inputting/outputting signals between memory cells and terminals. The inputted or outputted signals may include for example data.

The semiconductor apparatus may further include a data sensing circuit for sensing data to be transmitted through various signal lines.

During data sensing operations, current consumption may increase according to the voltage levels of the signal lines. Thus, the current consumption of the semiconductor apparatus may increase.

SUMMARY

In an embodiment, a data sensing circuit may include a pair of first signal lines, and a pair of second signal lines configured to be precharged with a first power supply voltage. The data sensing circuit may also include a line level control block configured to apply a second power supply voltage to any one signal line of the pair of second signal lines in response to a read command.

In an embodiment, a semiconductor apparatus may include a plurality of memory blocks respectively including one of a plurality of first signal sensing blocks which are coupled to a plurality of memory cell arrays through a plurality of pairs of first signal lines, and a plurality of pairs of second signal lines coupled to the first signal sensing blocks and precharged to a voltage level of a first power supply voltage level. The semiconductor apparatus may also include a plurality of line level control blocks coupled to the plurality of pairs of second signal lines. Whereby, with the first signal sensing blocks and the plurality of line level control blocks, a first signal sensing block and a line level control block corresponding to a memory block which may be activated among the plurality of memory blocks and are configured to sense data of a pair of first signal lines of the activated memory block.

DETAILED DESCRIPTION

Embodiments of a data sensing circuit and a semiconductor apparatus including the data sensing circuit will be described below with reference to the accompanying drawings.

Figure 1:
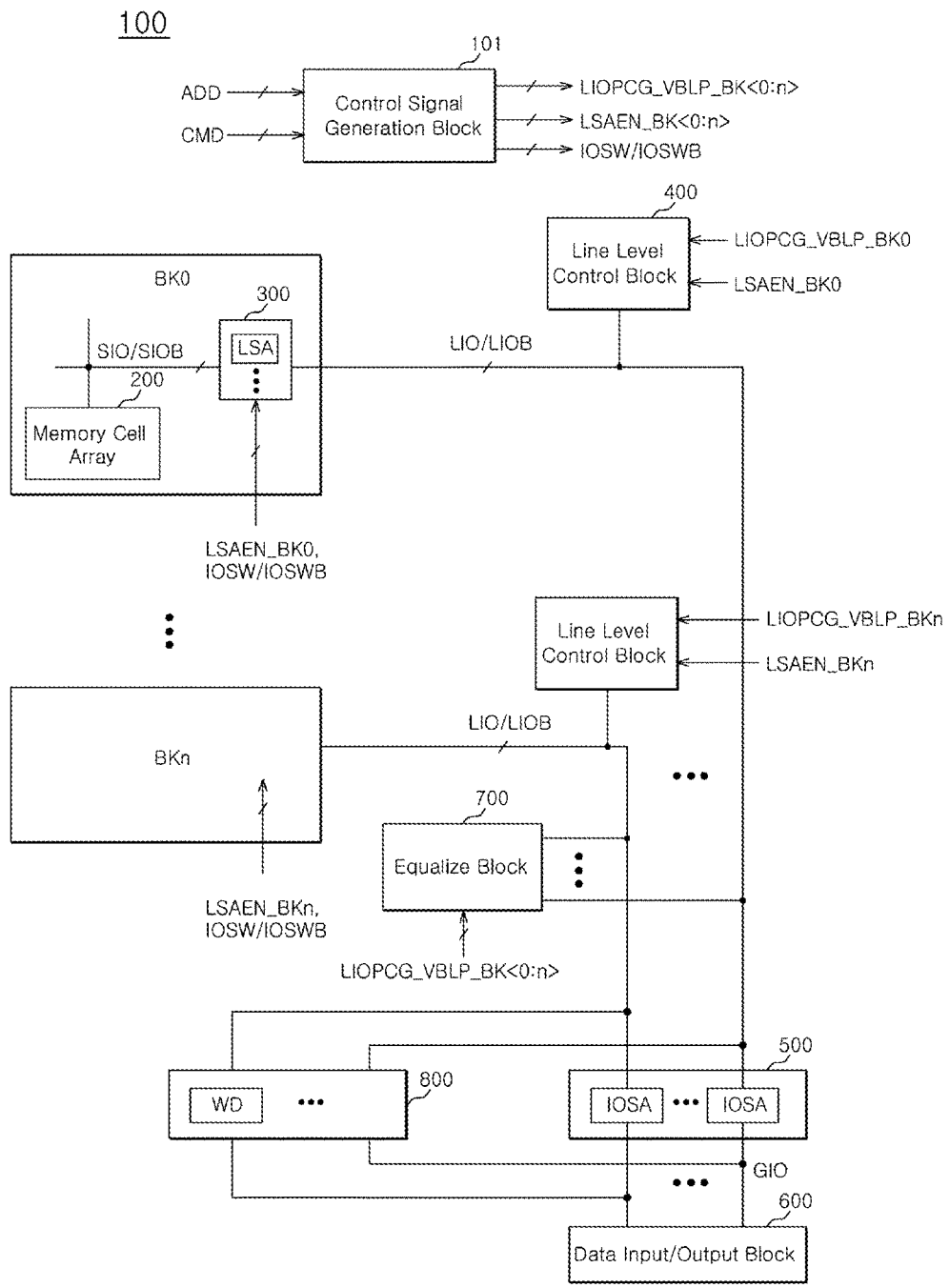
FIG. 1 is a block diagram representation of an embodiment of a semiconductor apparatus.

Referring to FIG. 1, a semiconductor apparatus 100 in accordance with an embodiment may include a control signal generation block 101, and a plurality of memory blocks BK0 to BKn each including a first signal sensing block 300. The semiconductor apparatus 100 may also include line level control blocks 400.

The semiconductor apparatus 100 may also include a second signal sensing block 500, and a data input/output block 600. The semiconductor apparatus 100 may also include an equalize block 700, and a write driver block 800.

The control signal generation block 101 may be configured to generate a plurality of control signal sets LIOPCG_VBLP_BK<0:n>, LSAEN_BK<0:n> and IOSW/IOSWB in response to an address signal ADD and a command CMD. These control signal sets may include activation information associated with the plurality of memory blocks BK0 to BKn.

The address signal ADD may include a plurality of memory block addresses (for example, memory bank addresses BA<j:k>) for selecting one of the plurality of memory blocks BK0 to BKn.

The command CMD signal may include, among other commands, an active command, a read command, a write command, and a precharge command.

The control signal generation block 101 may be configured to select a memory block among the plurality of memory blocks BK0 to BKn according to the address signal ADD. The control signal generation block 101 may also be configured to generate the plurality of control signal sets LIOPCG_VBLP_BK<0:n>, LSAEN_BK<0:n> and IOSW/IOSWB which may be in conformity with an operation timing determined according to the command CMD.

In an example where the read command is inputted and the block BK0 is selected among the plurality of memory blocks BK0 to BKn by the address signal ADD, the control signal generation block 101 may be configured to activate the control signals LIOPCG_VBLP_BK0, LSAEN_BK0 and IOSW/IOSWB. Additionally, these control signals LIOPCG_VBLP_BK0, LSAEN_BK0 and IOSW/IOSWB may correspond to the memory bank BK0 among the plurality of control signal sets LIOPCG_VBLP_BK<0:n>, LSAEN_BK<0:n> and IOSW/IOSWB, in conformity with a read operation timing.

In an example, the control signals IOSW/IOSWB may be generated in to be shared by the plurality of memory blocks BK0 to BKn.

The first control signal set LIOPCG_VBLP_BK<0:n> may be signals for controlling a selective precharge of pairs of second signal lines LIO/LIOB coupled to the plurality of memory blocks BK0 to BKn.

The second control signal set LSAEN_BK<0:n>, for example, may be signals for controlling selective activation/deactivation of the first signal sensing blocks 300 of the plurality of memory blocks BK0 to BKn.

The third control signal set IOSW/IOSWB, for example, may be signals for controlling electrical coupling/decoupling between pairs of first signal lines SIO/SIOB and the pairs of second signal lines LIO/LIOB.

The plurality of memory blocks BK0 to BKn may be, for example, defined by dividing the entire memory region of a semiconductor apparatus into a predetermined number of unit regions. The respective unit regions may be defined as memory banks.

The plurality of memory blocks BK0 to BKn may be coupled to the second signal sensing block 500. This coupling may be done through the plurality of pairs of second signal lines LIO/LIOB, respectively.

The line level control blocks 400 may be electrically coupled or communicatively coupled to the plurality of pairs of second signal lines LIO/LIOB, respectively.

Each of the plurality of memory blocks BK0 to BKn may include a memory cell array 200 and the first signal sensing block 300.

The plurality of memory blocks BK0 to BKn may be configured in the same way or substantially the same way.

Hereafter, descriptions will be made with reference to one pair of first signal lines SIO/SIOB of the plurality of pairs of first signal lines SIO/SIOB. However, there may be more than one pair of first signal lines SIO/SIOB as the embodiments are not limited in this way. Additionally, the descriptions will be made with reference to one pair of second signal lines LIO/LIOB of the plurality of pairs of second signal lines LIO/LIOB. However, there may be more than one pair of second signal lines LIO/LIOB as the embodiments are not limited in this way. Also, the descriptions hereafter, for example purposes only, will be made with reference to the line level control block 400 which is coupled to the one pair of second signal lines LIO/LIOB.

The first signal sensing block 300 may be coupled to the memory cell array 200 through the pair of first signal lines SIO/SIOB.

The first signal sensing block 300 may include a plurality of sense amplifiers LSA.

The first signal sensing block 300 may be configured to sense and amplify the data of the pair of first signal lines SIO/SIOB according to the control signals LSAEN_BK0 and IOSW/IOSWB. Also, the first signal sensing block 300 may be configured to transmit resultant data to the pair of second signal lines LIO/LIOB.

The second signal sensing block 500 may include a plurality of sense amplifiers IOSA.

The line level control block 400 may be electrically coupled to or communicatively coupled with the pair of second signal lines LIO/LIOB.

The line level control block 400 may be configured to determine a read operation in response to the control signals LIOPCG_VBLP_BK0 and LSAEN_BK0. Also, the line level control block 400 may be configured to control the voltage levels of the pair of second signal lines LIO/LIOB in conformity with the read operation.

The equalize block 700 may be electrically coupled to or communicatively coupled with the pair of second signal lines LIO/LIOB.

The equalize block 700 may be configured to equalize the pair of second signal lines LIO/LIOB coupled to a memory block corresponding to a control signal activated in the first control signal set LIOPCG_VBLP_BK<0:n>. For example, the equalize block 700 may be configured to equalize the pair of second signal lines LIO/LIOB to the level of a first power supply voltage VBLP.

The second signal sensing block 500 may be coupled to the data input/output block 600 through third signal lines GIO.

The data input/output block 600 may include input/output pads (DQ). The data input/output block 600 may be a terminal circuit block for implementing input/output of data with respect to an exterior of a semiconductor apparatus.

The write driver block 800 may include a plurality of write drivers WD among other drivers.

The write driver block 800 may be configured to transmit the data received through the data input/output block 600 through the pair of second signal lines LIO/LIOB. The data received from the data input/output block 600 may be received from outside the control signal generation block 100 or the data input/output block 600.

The pair of first signal lines SIO/SIOB may be defined as segment signal lines. The pair of second signal lines LIO/LIOB may be defined as local signal lines. The third signal lines GIO may be defined as global signal lines.

Figure 2:
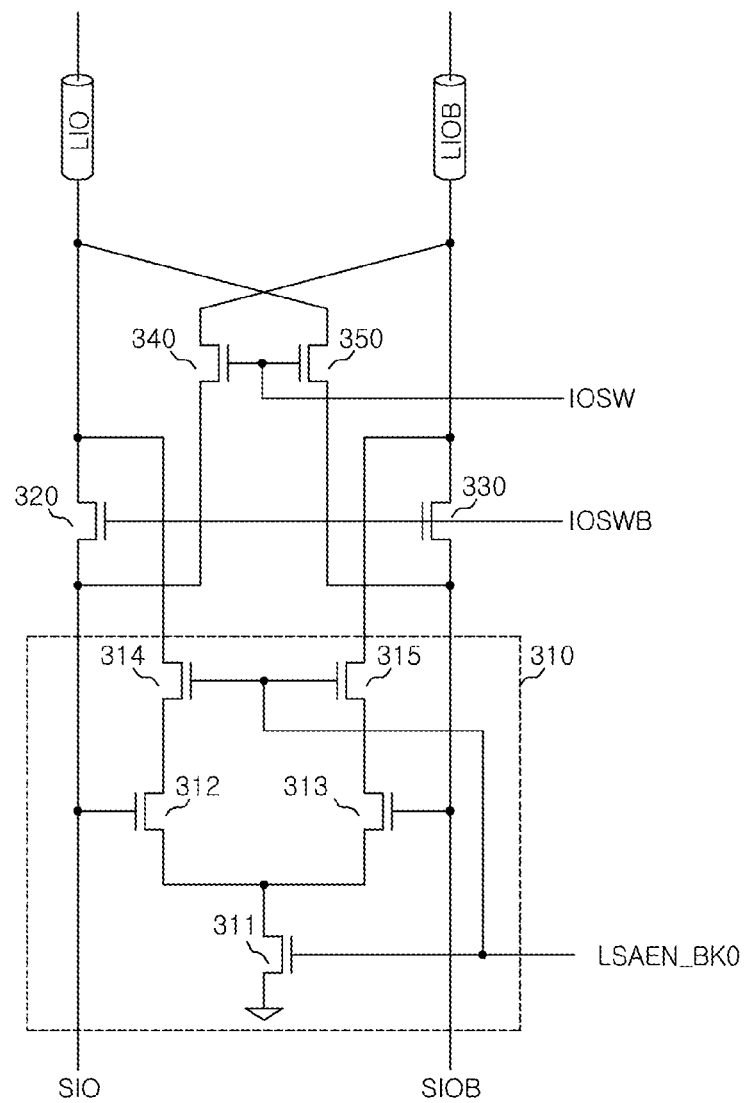
FIG. 2 is a circuit diagram representation of the LSA shown in FIG. 1.

Referring to FIG. 2, the sense amplifier LSA of the first signal sensing block 300 is shown. The first signal sensing block 300 may include a sensing unit 310 and first to fourth switches 320 to 350.

The sensing unit 310 may include first to fifth transistors 311 to 315.

The first transistor 311 may have, for example, a source which is coupled to a ground terminal, and a gate which is configured to receive the control signal LSAEN_BK0.

The second and third transistors 312 and 313 may have, for example, sources which are commonly coupled to a drain of the first transistor 311, and gates which may be respectively coupled to the first signal line SIO and the first signal line SIOB.

The fourth transistor 314 may have, for example, a source which may be coupled to the drain of the second transistor 312, and a gate which is configured to receive the control signal LSAEN_BK0.

The fifth transistor 315 may have a source which is coupled to the drain of the third transistor 313, and a gate which is configured to receive the control signal LSAEN_BK0.

The first and second switches 320 and 330 may be configured to electrically couple or decouple the signal lines SIO and LIO to and from each other. The first and second switches 320 and 330 may be configured to electrically couple or decouple the signal lines SIOB and LIOB to and from each other.

The third and fourth switches 340 and 350 may be configured to electrically couple or decouple the signal lines SIO and LIOB to and from each other. The third and fourth switches 340 and 350 may be configured to electrically couple or decouple the signal lines SIOB and LIO to and from each other.

The sensing unit 310 may pull down any one of the pair of second signal lines LIO/LIOB. The pair of second signal lines LIO/LIOB may be pulled down to a ground voltage VSS level according to a difference in the levels of the pair of first signal lines SIO/SIOB. This may occur when the control signal LSAEN_BK0 is activated.

Figure 3:
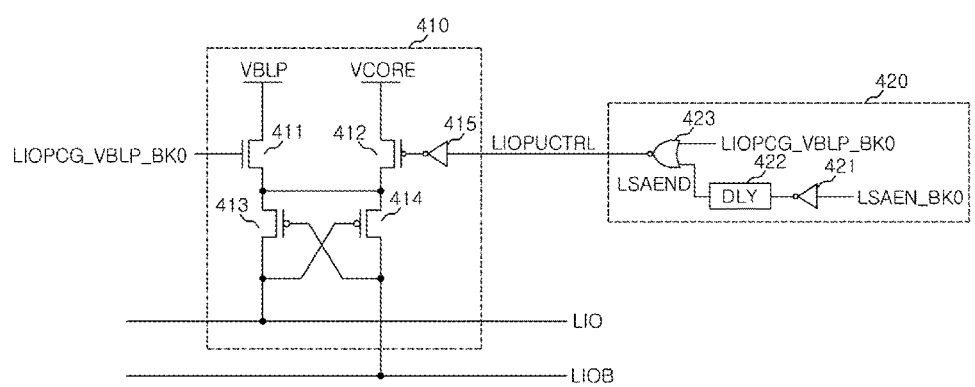
FIG. 3 is a circuit diagram representation of the line level control block shown in FIG. 1.

Referring to FIG. 3, the line level control block 400 may be configured to control the voltage levels of the pair of second signal lines LIO/LIOB in conformity with the read operation. The line level control block 400 may control the voltage levels of the pair of second signal lines LIO/LIOB in response to the control signals LIOPCG_VBLP_BK0 and LSAEN_BK0.

The line level control block 400 may be configured to precharge any one of the pair of second signal lines LIO/LIOB to the level of the first power supply voltage VBLP. This may be performed in response to the control signal LIOPCG_VBLP_BK0. Additionally, the line level control block 400 may be configured to pull up any one of the pair of second signal lines LIO/LIOB to the level of a second power supply voltage VCORE. This may be performed in response to a line level control signal LIOPUCTRL, to conform to the read operation.

The line level control block 400 may be configured to pull-up any one of the pair of second signal lines LIO/LIOB to the level of the second power supply voltage VCORE for a partial period of the deactivation period of the control signal LIOPCG_VBLP_BK0. The line level control block 400 may pull-up any one of the pair of second signal lines LIO/LIOB in response to the activation of the line level control signal LIOPUCTRL.

The second power supply voltage VCORE may be a voltage level higher than the first power supply voltage VBLP, for example, this level higher may be a level corresponding to two times the first power supply voltage VBLP, amongst other amounts.

The line level control block 400 may include a latch unit 410 and a signal generation logic 420.

The latch unit 410 may include a semi-latch 413 and 414 and a first switch 411. The latch unit 410 may also include a second switch 412 and an inverter 415.

The first switch 411 may be configured to supply the first power supply voltage VBLP to the semi-latchs 413 and 414 in response to receiving the control signal LIOPCG_VBLP_BK0.

The second switch 412 may be configured to supply the second power supply voltage VCORE to the semi-latchs 413 and 414 in response to receiving the line level control signal LIOPUCTRL.

The semi-latch 413 and 414 may be a half latch. A half latch may use, for example, only one half of a full latch constituted by a PMOS cross-coupled latch and an NMOS cross-coupled latch, for example, only the PMOS cross-coupled latch.

The latch unit 410 may be configured to pull up any one of the pair of second signal lines LIO/LIOB to the voltage level of the second power supply voltage VCORE. Additionally, the latch unit 410 may be configured to precharge any one of the pair of second signal lines LIO/LIOB to the level of the first power supply voltage VBLP.

The signal generation logic 420 may be configured to generate the line level control signal LIOPUCTRL in response to receiving the control signals LIOPCG_VBLP_BK0 and LSAEN_BK0.

The signal generation logic 420 may include an inverter 421, and a delay 422. The signal generation logic 420 may also include a NOR gate 423.

The inverter 421 may invert the control signal LSAEN_BK0 and may then output a resultant signal.

The delay 422 may delay the output signal of the inverter 421 by a predetermined time, and may then output an output signal LSAEND.

The NOR gate 423 may perform a logic operation on the output signal LSAEND of the delay 422 and the control signal LIOPCG_VBLP_BK0, and then the NOR gate 423 may output the line level control signal LIOPUCTRL.

The line level control signal LIOPUCTRL is activated at the deactivation time of the control signal LIOPCG_VBLP_BK0. For example, the line level control signal LIOPUCTRL is activated after the delay time of the delay 422 from a time when the read command is inputted, and is deactivated before a precharge command PCG (see FIG. 4) is inputted, for example, at the activation time of the control signal LIOPCG_VBLP_BK0.

Figure 4:
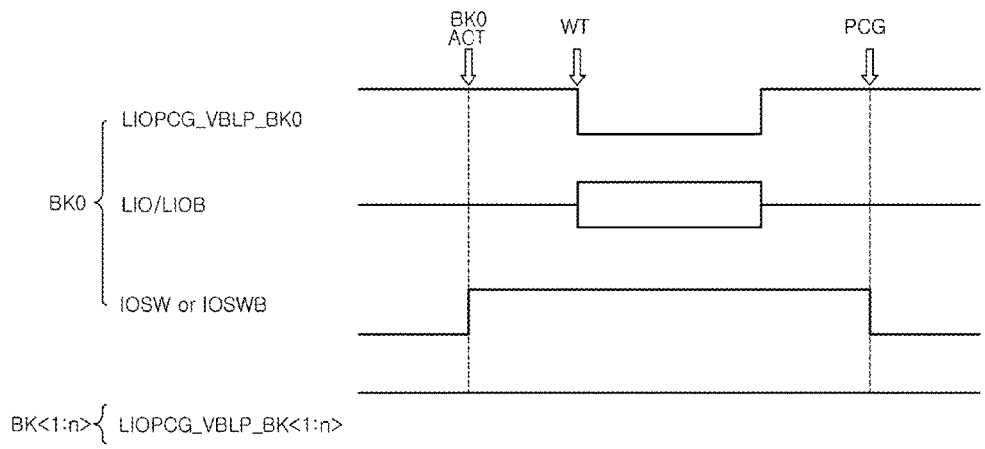
FIG. 4 is a timing diagram illustrating the write operation of a semiconductor apparatus in accordance with an embodiment.

With reference to FIG. 4, the write operation of the semiconductor apparatus 100 will be described below.

During the input of an active command BK0 ACT, the memory block BK0 is activated, and any one of the third set of control signals IOSW/IOSWB, for example, the control signal IOSWB is activated.

In response to the control signal IOSWB, the first and second switches 320 and 330 of FIG. 2 may electrically couple the pair of second signal lines LIO/LIOB to the pair of first signal lines SIO/SIOB.

During the input of a write command WT, the data received by the data input/output block 600 from outside the data input/output block 600 or the control signal generation block 100 may be transmitted to the pair of second signal lines LIO/LIOB through the write driver block 800.

Any one of the pair of second signal lines LIO/LIOB may transition to a high voltage level, and the other of the pair of second signal lines LIO/LIOB may transition to a low voltage level.

When the pair of second signal lines LIO/LIOB and the pair of first signal lines SIO/SIOB are coupled to each other, the data transmitted to the pair of second signal lines LIO/LIOB may be written into the memory cell array 200 of the memory block BK0 through the pair of first signal lines SIO/SIOB.

When the control signal LSAEN_BK0 is deactivated in response to the write command WT, the line level control block 400 of FIG. 3 may electrically couple the first power supply voltage VBLP to any one of the pair of second signal lines LIO/LIOB during the activation period of the control signal LIOPCG_VBLP_BK0.

During the reception of a precharge command PCG, the control signal IOSWB is deactivated. Thus, the first and second switches 320 and 330 of FIG. 2 may electrically decouple the pair of second signal lines LIO/LIOB and the pair of first signal lines SIO/SIOB from each other in response to the control signal IOSWB.

The equalize block 700 may equalize the pair of second signal lines LIO/LIOB to the voltage level of the first power supply voltage VBLP in response to the control signal LIOPCG_VBLP_BK0.

Figure 5:
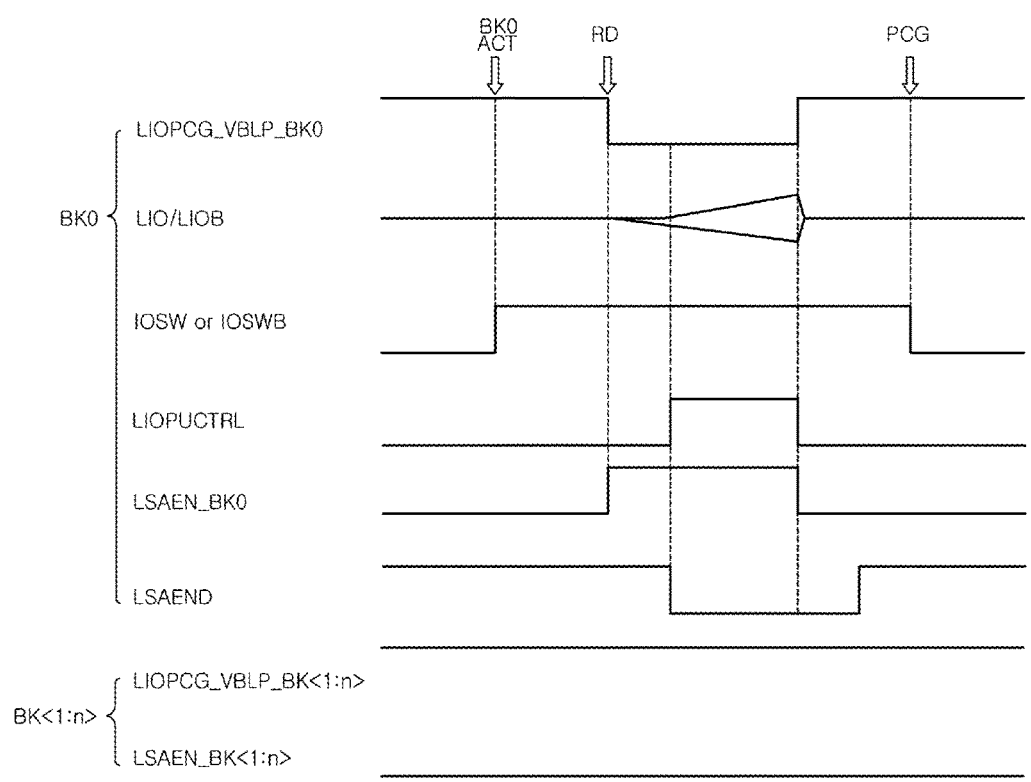
FIG. 5 is a timing diagram illustrating the read operation of a semiconductor apparatus in accordance with an embodiment.

Referring to FIG. 5, the read operation of the semiconductor apparatus 100 will be described below.

During the reception of an active command BK0 ACT, the memory block BK0 is activated, and any one of the third set of control signals IOSW/IOSWB, for example, the control signal IOSWB is activated.

In response to the control signal IOSWB the first and second switches 320 and 330 of FIG. 2 may electrically couple the pair of second signal lines LIO/LIOB and the pair of first signal lines SIO/SIOB with each other.

During the reception of a read command RD, the control signal LIOPCG_VBLP_BK0 is deactivated. During the reception of a read command RD, the control signal LSAEN_BK0 is activated.

While the control signal LSAEN_BK0 is activated, the sense amplifier LSA of FIG. 2 senses the data transmitted from the memory cell array 200 to the pair of first signal lines SIO/SIOB and then transmits the sensed data to the pair of second signal lines LIO/LIOB.

Due to the sensing operation of the sense amplifier LSA of FIG. 2, a level difference is induced between the pair of second signal lines LIO/LIOB. This level difference induced between the pair of second signal lines LIO/LIOB may be in correspondence with the level difference between the pair of first signal lines SIO/SIOB.

In the sensing operation of the sense amplifier LSA of FIG. 2, any one of the pair of second signal lines LIO/LIOB, for example, the signal line LIO may rise to the voltage level of the first power supply voltage VBLP. Additionally, in the sensing operation of the sense amplifier LSA of FIG. 2, the other pair of second signal lines LIO/LIOB, for example, the signal line LIOB may fall to the voltage level of the ground voltage VSS level.

Referring to FIG. 3, the line level control signal LIOPUCTRL is activated after the delay time of the delay 422 and from the activation time of the control signal LSAEN_BK0.

During the period when the line level control signal LIOPUCTRL is activated, the line level control block 400 of FIG. 3 may pull up the signal line LIO of the pair of second signal lines LIO/LIOB to the voltage level of the second power supply voltage VCORE level.

Referring to FIG. 5, it may be seen that the voltage level difference between the pair of second signal lines LIO/LIOB abruptly increases from the activation time of the line level control signal LIOPUCTRL when compared to the input time of the read command RD, that is, the activation time of the control signal LSAEN_BK0.

During the period when the control signal LIOPCG_VBLP_BK0 is activated and the control signal LSAEN_BK0 is deactivated, the line level control signal LIOPUCTRL is deactivated.

During the period when a precharge command PCG is received, the control signal IOSWB is deactivated. Referring to FIG. 2 and in response to the control signal IOSWB, the first and second switches 320 and 330 may electrically decouple the pair of second signal lines LIO/LIOB and the pair of first signal lines SIO/SIOB from each other.

in response to the control signal LIOPCG_VBLP_BK0 the equalize block 700 may equalize the pair of second signal lines LIO/LIOB to the voltage level of the first power supply VBLP level.

Meanwhile, the sets of first and second control signals LIOPCG_VBLP_BK<1: n> and LSAEN_BK<1: n> corresponding to the memory blocks BK<1:n> which are not activated are retained at a high voltage level and a low voltage level, respectively.

In the above-described embodiments, in the read operation, the sense amplifier LSA of FIG. 2 and the line level control block 400 of FIG. 3 operate as data sensing circuits which sense the data of the pair of first signal lines SIO/SIOB and transmit the sensed data to the pair of second signal lines LIO/LIOB.

The sense amplifier LSA of FIG. 2 pulls down any one (for example, the signal line LIO) of the pair of second signal lines LIO/LIOB to the voltage level of the ground voltage VSS level according to the voltage level difference between the pair of first signal lines SIO/SIOB. Additionally, the line level control block 400 of FIG. 3 pulls up the other (for example, the signal line LIOB) of the pair of second signal lines LIO/LIOB.

In an embodiment, the pair of second signal lines LIO/LIOB are precharged to the voltage level of the first power supply voltage VBLP regardless of the active command BK0 ACT until the read command RD by which actual sensing for the pair of first signal lines SIO/SIOB is implemented and received.

After the read command RD, the voltage level difference between the pair of second signal lines LIO/LIOB begins to increase. Then, after the predetermined time, that is, from the activation time of the line level control signal LIOPUCTRL, a data sensing operation is performed for the pair of first signal lines SIO/SIOB in such a way as to abruptly increase the voltage level difference between the pair of second signal lines LIO/LIOB by using the second power supply voltage VCORE having the voltage level higher than the first power supply voltage VBLP.

In an embodiment, a precharge time using the first power supply voltage VBLP with a relatively low voltage level is retained as long as possible, and the second power supply voltage VCORE is used only when needed, that is, for example, only while the data sensing operation is actually performed.

Additionally the set of second control signals LSAEN_BK<1:n> provided to the memory blocks BK<1:n> which are not activated may be retained at a deactivated state (i.e., a low level).

The line level control signals LIOPUCTRL of the line level control blocks 400 coupled to the pairs of second signal lines LIO/LIOB which are coupled to the deactivated memory blocks BK<1:n> may also be retained at a deactivated state.

Accordingly, while the data sensing operation is performed for the activated memory block BK0, it is possible to prevent the pairs of second signal lines LIO/LIOB coupled to the deactivated memory blocks BK<1:n> from being pulled up by the second power supply voltage VCORE. Thus, the current consumption may be reduced by performing in this way.

As is apparent from the above descriptions, it may be possible to reduce current consumption while stably and reliably sensing data.

Figure 6:
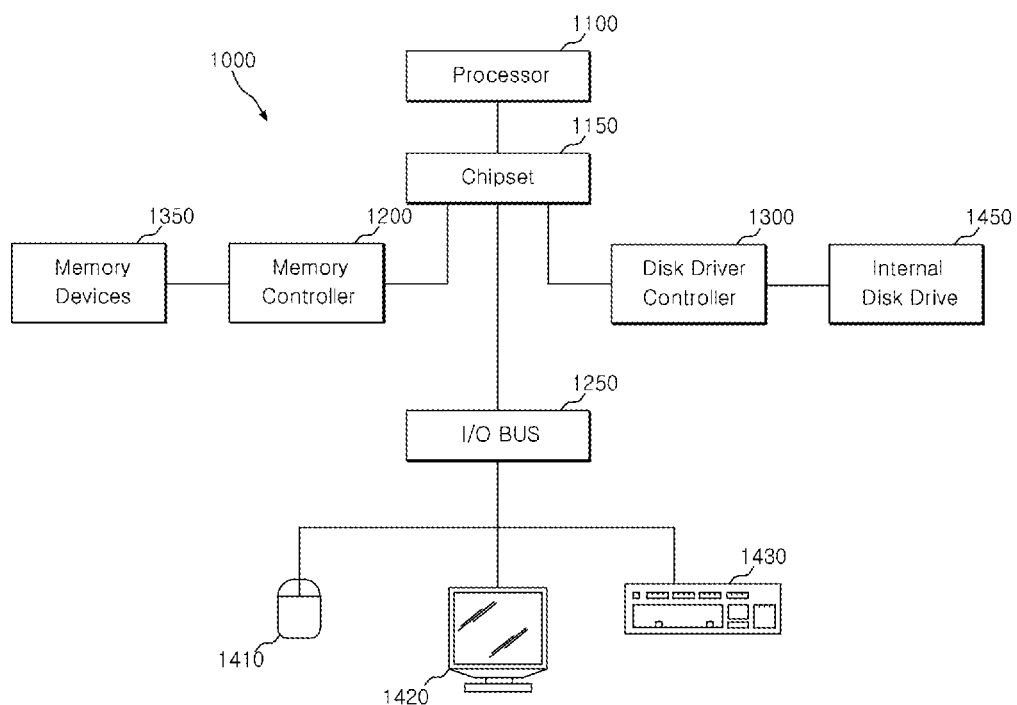
FIG. 6 illustrates a block diagram of a system employing the semiconductor apparatus in accordance with the embodiments discussed above with relation to FIGS. 1-5.

The semiconductor apparatus discussed above is particular useful in the design of memory devices, processors, and computer systems. For example, referring to FIG. 6, a block diagram of a system employing the semiconductor apparatus in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the semiconductor apparatus as discussed above with relation to FIGS. 1-5, the memory devices 1350 may include a plurality of word lines and a plurality of bit lines for defining a plurality of memory cell. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the semiconductor apparatus as discussed above with relation to FIGS. 1-5. In alternate embodiments, such as cellular phones or digital cameras, the components may differ from the embodiments shown in FIG. 6.

While various embodiments have been described above, it will be understood to those skilled in the art that the embodiments described are by way of example only. Accordingly, the data sensing circuit and the semiconductor apparatus using the same described herein should not be limited based on the described embodiments. Rather, the data sensing circuit and the semiconductor apparatus using the same described herein should only be limited in light of the claims that follow when taken in conjunction with the above description and accompanying drawings.

What is claimed is:

1. A semiconductor apparatus comprising:
   a plurality of memory blocks respectively including one of a plurality of first signal sensing blocks which are coupled to a plurality of memory cell arrays through a plurality of pairs of first signal lines;
   a plurality of pairs of second signal lines coupled to the first signal sensing blocks; and
   a plurality of line level control blocks coupled to the plurality of pairs of second signal lines,
   wherein the line level control block comprises:
     a latch unit configured to apply a second power supply voltage to each one of the plurality of pairs of second signal lines which are coupled therewith, in response to a line level control signal; and
     a signal generation logic configured to generate the line level control signal which is activated after a predetermined time passes after a read command and is deactivated prior to receiving a precharge command.

2. The semiconductor apparatus according to claim 1, further comprising:
   a control signal generation block configured to create a plurality of sets of control signals which have activation information of the memory block, in response to an address signal and a command.

3. The semiconductor apparatus according to claim 2, wherein the plurality of sets of control signals comprise:
   a set of first control signals configured for controlling selective precharge of the plurality of pairs of second signal lines; and
   a set of second control signals configured for controlling selective activation of the first signal sensing blocks.

4. The semiconductor apparatus according to claim 3, wherein the plurality of sets of control signals further comprise:
   a set of third control signals configured for controlling electrical coupling/decoupling of the plurality of pairs of first signal lines and the plurality of pairs of second signal lines.

5. The semiconductor apparatus according to claim 3, further comprising:
   an equalize block configured to equalize the plurality of pairs of second signal lines in response to the set of first control signals.

6. The semiconductor apparatus according to claim 3, wherein the line level control block, corresponding to the memory block which is activated among the plurality of memory blocks, is configured to apply the second power supply voltage to each one of the plurality of pairs of second signal lines which are coupled therewith, in response to one of the set of first control signals and one of the set of second control signals corresponding to the activated memory block.

7. The semiconductor apparatus according to claim 6, wherein the first signal sensing block, corresponding to the memory block which is activated among the plurality of memory blocks, is configured to apply a ground voltage to the other signal line of each of the plurality of pairs of second signal lines which are coupled therewith, in response to a control signal corresponding to the activated memory block among the set of second control signals.

8. The semiconductor apparatus according to claim 6, wherein the line level control block is configured to apply the second power supply voltage to each one of the plurality of pairs of second signal lines which are coupled therewith, after a predetermined time passes after an activation time of the one of the set of first control signals and the one of the set of second control signals corresponding to the activated memory block.

9. The semiconductor apparatus according to claim 3, wherein the line level control block comprises:
   the latch unit configured to apply the second power supply voltage to each one of the plurality of pairs of second signal lines which are coupled therewith, in response to the line level control signal; and
   the signal generation logic configured to generate the line level control signal in response to the set of first control signals and the set of second control signals.

10. The semiconductor apparatus according to claim 9, wherein the latch unit comprises a semi-latch including any one of a PMOS cross-coupled latch and an NMOS cross-coupled latch.

11. The semiconductor apparatus according to claim 1, further comprising:
   a second signal sensing block coupled to the plurality of pairs of second signal lines; and
   a data input/output block coupled to the second signal sensing block through a plurality of third signal lines.

12. The semiconductor apparatus according to claim 11, wherein the data input/output block comprises a plurality of input/output pads.

* * * * *